United States Patent
Abdelfattah Aly

(10) Patent No.: US 9,264,032 B2
(45) Date of Patent: Feb. 16, 2016

(54) VOLTAGE PROTECTION SCHEME FOR SEMICONDUCTOR DEVICES

(71) Applicant: Broadcom Corporation, Irvine, CA (US)

(72) Inventor: Khaled Mahmoud Abdelfattah Aly, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 72 days.

(21) Appl. No.: 13/927,666

(22) Filed: Jun. 26, 2013

(65) Prior Publication Data

US 2014/0376139 A1     Dec. 25, 2014

Related U.S. Application Data

(60) Provisional application No. 61/837,299, filed on Jun. 20, 2013.

(51) Int. Cl.
    *H02H 3/20*     (2006.01)
    *H03K 17/082*     (2006.01)

(52) U.S. Cl.
    CPC .................................. *H03K 17/0822* (2013.01)

(58) Field of Classification Search
    CPC ........................... H02H 9/041; H03K 17/0822
    See application file for complete search history.

(56) References Cited

U.S. PATENT DOCUMENTS

| | | | |
|---|---|---|---|
| 7,385,793 B1 * | 6/2008 | Ansel et al. | 361/56 |
| 8,493,154 B1 * | 7/2013 | Camargo et al. | 330/311 |
| 2007/0052480 A1 * | 3/2007 | Pastorina et al. | 330/288 |

* cited by examiner

*Primary Examiner* — Thienvu Tran
*Assistant Examiner* — Tien Mai
(74) *Attorney, Agent, or Firm* — Oblon, McClelland, Maier & Neustadt, L.L.P.

(57) ABSTRACT

Various examples are provided for voltage protection of semiconductor devices. In one example, among others, a circuit includes a MOS device, a protective device connected between the MOS device and an output voltage connection, and gate protection circuitry configured to provide a bias voltage to a gate of the protective device. The bias voltage includes a DC bias component and an AC bias component that synchronously varies with a voltage of the output voltage connection. Another example includes a plurality of protective devices connected between the MOS device and the output voltage connection. The gate protection circuitry may be configured to provide a plurality of bias voltages to the plurality of protective devices. In another example, a method includes attenuating an output voltage, combining the attenuated output voltage with a constant offset voltage to generate a gate bias voltage, and providing the gate bias voltage to a protective device.

18 Claims, 6 Drawing Sheets

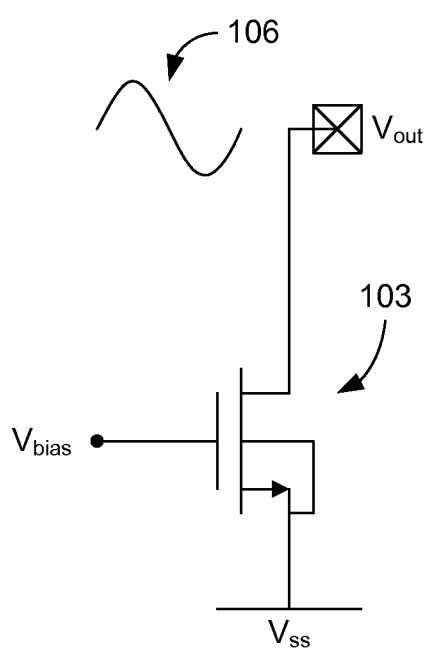
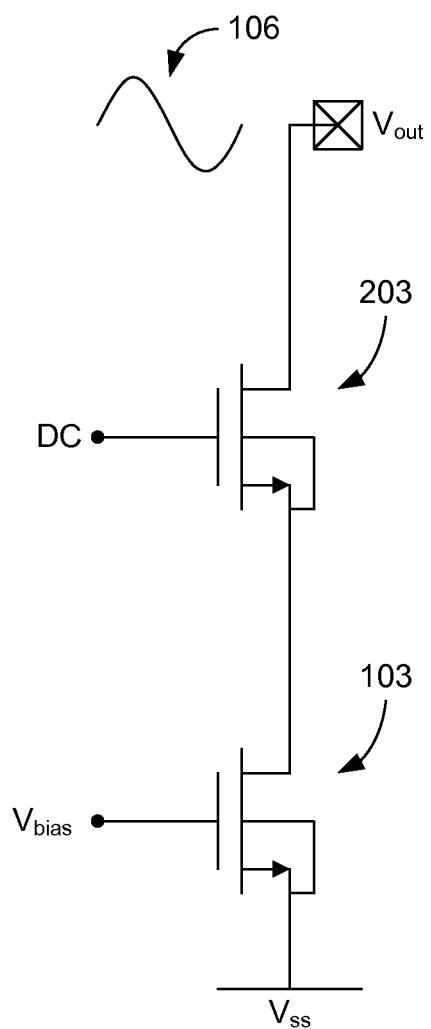
FIG. 1     FIG. 2

US 9,264,032 B2
// 1

VOLTAGE PROTECTION SCHEME FOR SEMICONDUCTOR DEVICES

CROSS REFERENCE TO RELATED APPLICATIONS

This application claims priority to U.S. provisional application entitled "Voltage protection scheme for semiconductor devices" having Ser. No. 61/837,299, filed Jun. 20, 2013, the entirety of which is hereby incorporated by reference.

BACKGROUND

Metal oxide semiconductor field-effect transistor (MOSFET) devices are the most common transistors in digital and analog circuits. Low voltage p- and n-channel MOSFET devices are used in digital complementary metal oxide semiconductor (CMOS) logic as building blocks for integrated circuits. For example, audio, microwave, radio frequency (RF), and other processing and/or communications circuits include MOSFET devices to implement their functionality. Over the past decade, MOSFET devices have been scaled down in size allowing for higher densities of devices and higher operating speeds.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 is a graphical representation illustrating an example of a metal oxide semiconductor (MOS) device in accordance with various embodiments of the present disclosure.

FIG. 2 is a graphical representation illustrating an example a circuit including a protective device and the MOS device of FIG. 1 in accordance with various embodiments of the present disclosure.

DETAILED DESCRIPTION

Figure 3A:
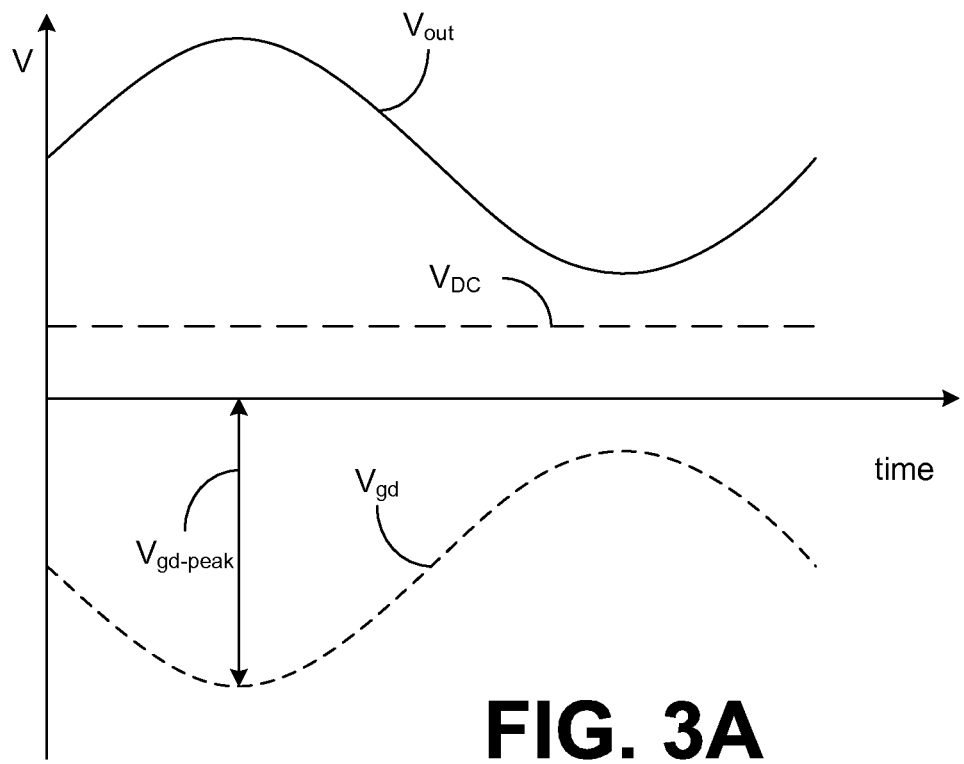
FIGS. 3A-3B are plots illustrating the effect of the gate voltage on the gate-to-drain voltage on the protective device of FIG. 2 in accordance with various embodiments of the present disclosure.

Disclosed herein are various embodiments related to voltage protection for semiconductor devices. Reference will now be made in detail to the description of the embodiments as illustrated in the drawings, wherein like reference numbers indicate like parts throughout the several views.

Referring to FIG. 1, shown is an example of a metal oxide semiconductor (MOS) device 103 such as, e.g., a field-effect transistor (MOSFET) device, used in many processing and/or communications circuits used in integrated circuit (IC) chips and/or processing circuitry found in electrical and electronic equipment such as, e.g., set-top boxes, televisions, computers, tablets, cellular telephones, etc. Low voltage MOS devices 103 can be suitable for operation at voltages of, e.g., less than or equal to 5.0V, 3.3V, 3.0V, 2.5V, 1.5V, 1.2V, and/or 1.0V. While the MOS devices 103 of FIGS. 1-2 and 4-7 are shown with the bulk tied to the source of the device, in other embodiments the bulk may be tied to a different voltage. The output of a MOS device 103 may be connected to an output connection and/or an internal node connection that sees a large voltage ($V_{out}$) swing.

MOS devices 103 can handle voltage swings 106 at the output of the device if the variations do not exceed the gate-to-drain voltage ($V_{gd}$) rating and/or the drain-to-source voltage ($V_{ds}$) rating of the MOS device 103. However, prolonged stress from excessively large voltage swings 106 that exceed the allowable ratings can result in failure or breakdown of the MOS device 103. Excessively large voltage swings 106 can produce similar breakdown in p-channel MOS (PMOS) devices and n-channel MOS (NMOS) devices. For example, set-top audio drivers need to deliver a standard $2V_{RMS}$ output voltage. The output stage of such a driver may be stressed given the high voltage swing.

To avoid exceeding the device rating, high voltage devices such as laterally diffused metal oxide semiconductor (LDMOS) devices may be utilized. However, LDMOS devices can be bulky and expensive from an area perspective. In addition, LDMOS devices may not function if the voltage swing across the drain is less than zero. If the circuit experiences a negative swing with respect to the ground-referenced output, the LDMOS cannot be used because the n-well cannot be implemented inside the deep n-well of the LDMOS device. To prevent such negative swings, a higher supply voltage can be used to allow the output to maintain the same swing as before. In the case of a higher supply voltage, the output will be centered around a DC value, which will require an off-chip capacitor to remove the DC offset. In some applications such as, e.g., audio applications, where the signal frequency can extend to a low frequency range, the off-chip capacitor would need to be very large which adds to the cost of the final product.

Protection from output voltage swings that can exceed the device rating can be provided by a protective device between the output and the MOS device 103. FIG. 2 shows an example of a protective device 203 connected in a cascode configuration between the MOS device 103 and the output voltage ($V_{out}$). In other implementations, the output of the protective device may be connected to an internal node of the circuitry that sees a large voltage ($V_{out}$) swing. Protective devices may be a low voltage MOS device and/or other MOS device suitable for the application. In some implementations, the protective device is the same as the MOS device 103. A constant DC bias voltage can be applied to the gate of the protective device 203 to protect the MOS device 103. FIG. 3A illustrates the relationship between the output voltage ($V_{out}$), the DC bias voltage ($V_{DC}$) and the gate-to-drain voltage ($V_{gd}$) of the protective device 203. As shown in FIG. 3A, the peak gate-to-drain voltage ($V_{gd-peak}$) is reduced. However, if the voltage swing 106 is sufficiently large, the DC bias voltage applied to the gate of the protective device 203 may not prevent the gate-to-drain voltage ($V_{gd}$) from stressing, and eventually breaking down, the protective device 203.

Figure 3B:
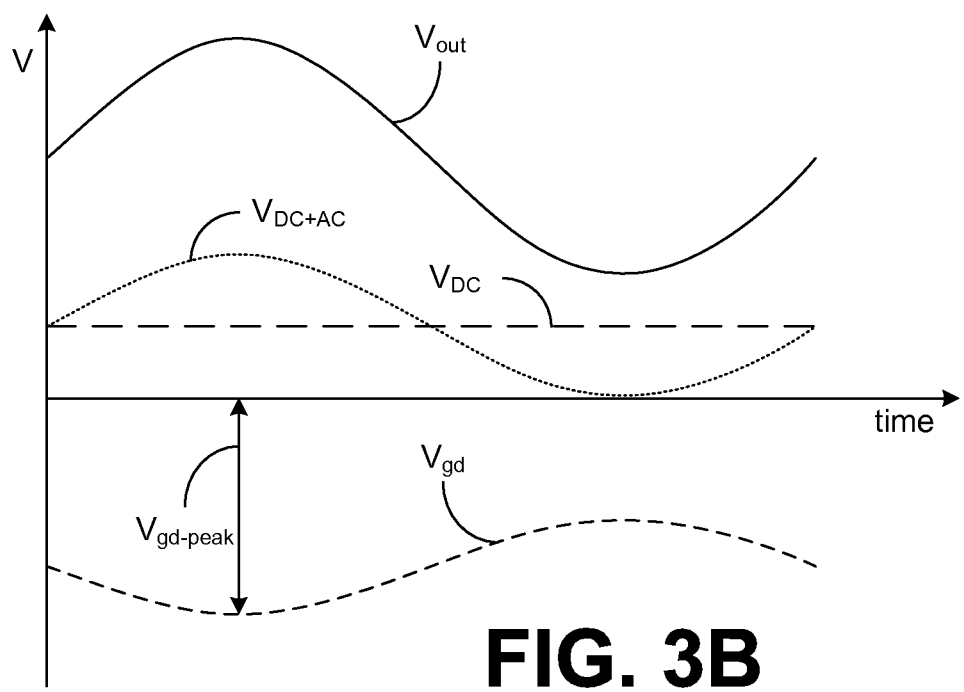

By adding an alternating (AC) bias component to the DC bias component of the gate voltage, the gate-to-drain voltage ($V_{gd}$) and/or the drain-to-source voltage ($V_{ds}$) of the protective device 203 may be further protected. Allowing the gate voltage of the protective device 203 to vary with the output voltage can reduce the peak $V_{gd}$ seen by the protective device 203. Synchronizing the variations of the AC component with the voltage swings 106 of the output voltage allows $V_{gd}$ of the protective device 203 to be maintained within the operational limits of the device. FIG. 3B illustrates the relationship between the output voltage ($V_{out}$), the combined bias voltage ($V_{DC+AC}$) and the gate-to-drain voltage ($V_{gd}$) of the protective device 203. As shown in FIG. 3B, the peak gate-to-drain voltage ($V_{gd\text{-}peak}$) 1 is further reduced when the AC bias component is synchronized with the output voltage.

Figure 4:
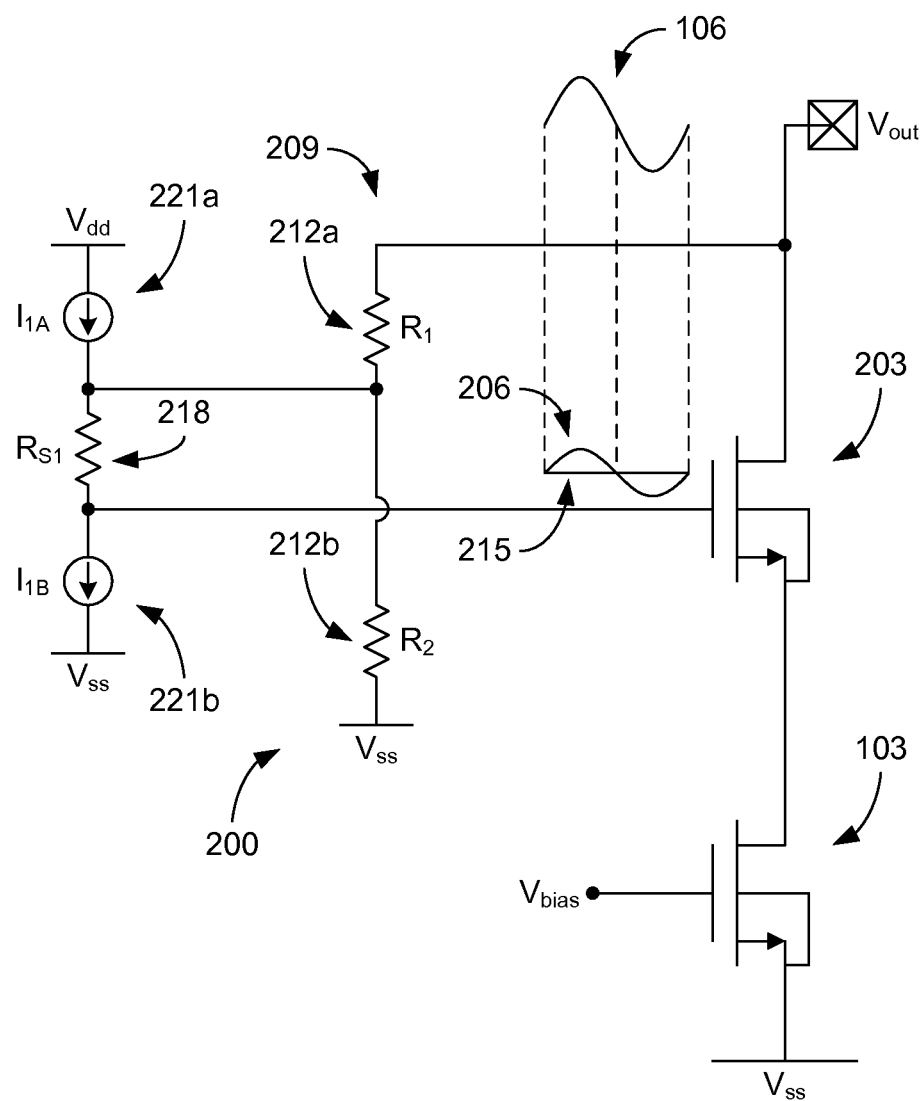
FIGS. 4-6 are graphical representations illustrating examples of a protection scheme for the MOS device of FIG. 1 in accordance with various embodiments of the present disclosure.

Referring to FIG. 4, shown is an example of a protection scheme for MOS devices such as, e.g., low voltage MOS devices used in IC chips and/or processing circuitry. FIG. 4 shows a current source at the MOS device 103. In other embodiments, the MOS device 103 being protected may have other functions or provide other functionality. If the voltage swing 106 at the output is sufficiently large, then the voltage difference ($V_{out}-V_{ss}$) can exceed the breakdown limit of the MOS device 103. $V_{ss}$ may be a negative voltage ($V_{neg}$) as in the example of FIG. 4, or may be a positive voltage ($V_{pos}$). Circuitry can be provided between the output and the MOS device 103 to protect the MOS device 103 from breakdown conditions. A protective device 203 can be added to reduce the voltage across the MOS device 103. Gate protection circuitry 200 controls the gate voltage applied to the protective device 203 to avoid exceeding the device ratings. The voltage applied to the gate of the protective device 203 may vary with the output voltage ($V_{out}$) to maintain $V_{gd}$ and/or $V_{ds}$ within acceptable operating limits.

A combination of AC and DC bias components is provided to the gate of the protective device 203 by the gate protection circuitry 200. The AC bias component 206 is an attenuated version of the voltage swing 106 at the output of the circuit. A voltage divider 209 such as, e.g., a resistance network including a plurality of resistors (e.g., $R_1$ 212a and $R_2$ 212b) is used to attenuate $V_{out}$. Other voltage dividers may also be used to provide the attenuated version of the voltage swing 106. For example, low voltage MOS devices may be used instead of resistors 212a and 212b. If low voltage MOS devices are used, then the voltage limits of the devices need to be considered in light of the voltage swings 106.

The DC bias component 215 is provided by a DC bias circuit including a resistor ($R_{S1}$) 218 connected between two current sources 221a and 221b as shown in FIG. 4. A constant DC bias voltage can be added to the AC bias component by controlling the currents ($I_{1A}$ and $I_{2A}$) of the current sources 221a and 221b to produce a fixed voltage drop across the resistor ($R_{S1}$) 218. In this way, a predefined current level ($I_{defined}=I_{1A}=I_{1B}$) for both current sources 221a and 221b produces a defined DC offset of the bias applied to the gate of the protective device 203. In some implementations, no DC offset (or shift) of the bias may be used ($I_{1A}=I_{1B}=0$) and only an AC bias component may be applied to the gate of the corresponding protective device 203. The AC and DC bias components are combined to produce the applied gate voltage. In the example of FIG. 4, the AC and DC bias components 206 and 215 are combined by connecting the voltage divider 209 to first side of the resistor ($R_{S1}$) 218 and connecting the second side of the resistor 218 to the gate of the protective device 203 to provide a negative shift. In other implementations, the connections may be reversed to provide a positive shift as in the case of a PMOS device.

To design the protection scheme, the level of the DC bias component 215 needed to operate the protective device 203 is first determined. Based at least in part upon the DC bias component 215 and the maximum allowable gate-to-drain voltage ($V_{gd}$), the amount of attenuation of the output voltage ($V_{out}$) can be determined. The peak-to-peak voltage seen by the MOS device 103 is reduced to approximately the voltage seen at the gate of the protective device 203. The elements of the voltage divider 209 may be determined for the attenuation to prevent exceeding the maximum allowable $V_{gd}$. For example, the values of the resistors 212a and 212b may be determined to provide an AC bias component 206 that would avoid exceeding the $V_{gd}$ limit of the protective device 203. By selecting the appropriate resistance values, the resistance network of FIG. 4 can provide an attenuated waveform that is in-phase with the voltage swings 106 of the output.

In some implementations, the bias voltage applied to the gate of the protective device 203 may be programmable to adjust for variations in the operating conditions of the circuit. For example, the pair of current sources 221a and 221b may be programmable or configurable to allow for changes in the current level to adjust the DC bias component 215. By adjusting the pair of current sources 221a and 221b together, the AC bias component 206 remains unchanged. The voltage divider 209 may also be programmable or configurable to allow for changes in the attenuation of the AC bias component 206. For example, the resistance values of resistors $R_1$ 212a and/or $R_2$ 212b may be adjustable. In other implementations, the resistors 212 may be replaced by low voltage MOS devices, which may be controlled to adjust the attenuation of the voltage swing 106.

Figure 5:
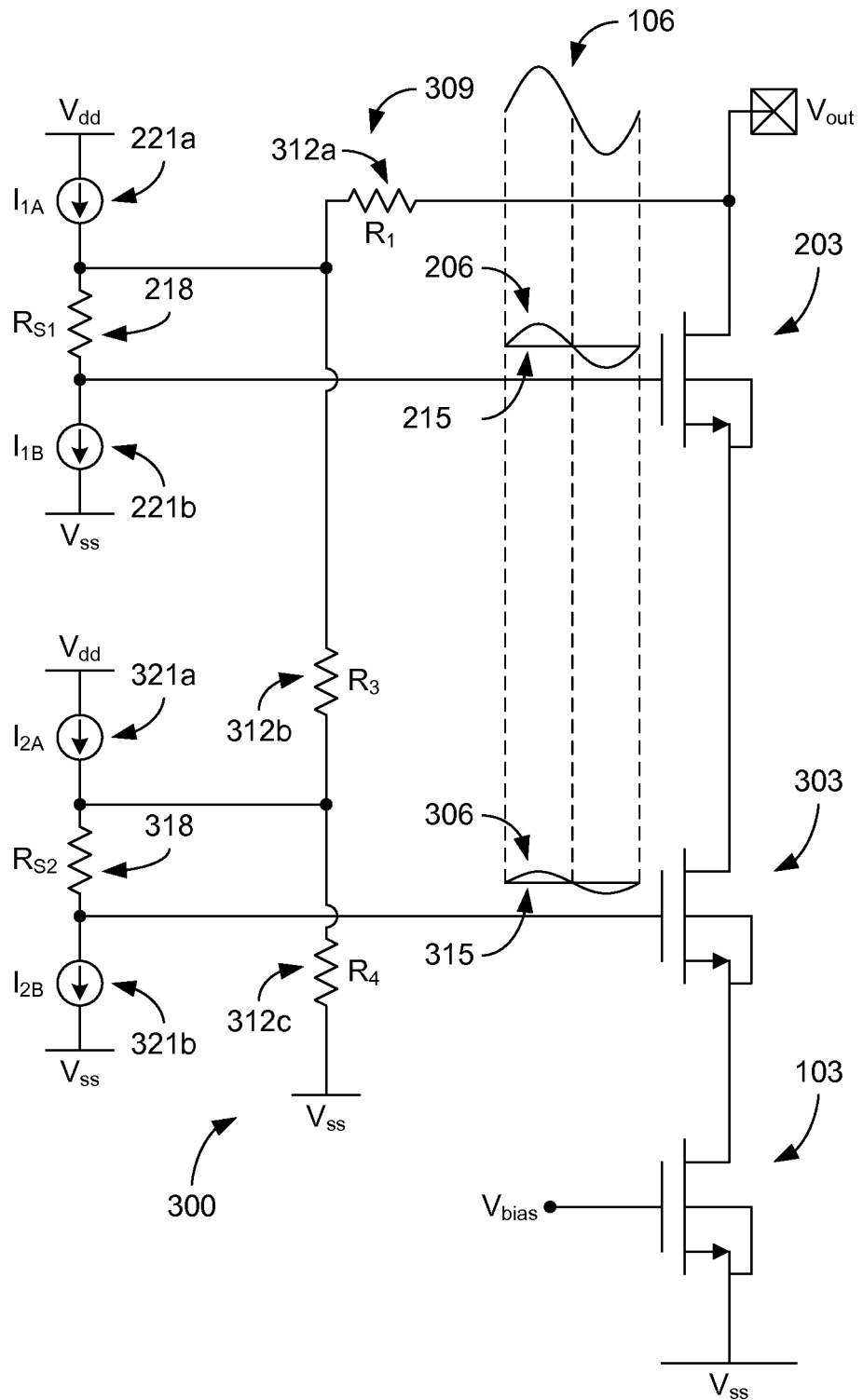

If the voltage swings 106 are larger than can be handled by a single protective device 203, then a plurality of protective devices may be used to avoid exceeding the maximum allowable $V_{gd}$. FIG. 5 shows another example of the protection scheme using a first protective device 203 and a second protective device 303 connected in a cascode configuration to reduce the voltage across the MOS device 103. Gate protection circuitry 300 controls the gate voltages applied to the first and second protective devices 203/303 to avoid exceeding the device ratings. A combination of AC and DC bias components is provided to the gates of the first and second protective devices 203/303.

For the first protective device 203, the AC bias component 206 is an attenuated version of the voltage swing 106 at the output corresponding to the MOS device 103. The AC bias component 306 for the second protective device 303 is another attenuated version of the voltage swing 106. Because the first protective device 203 reduces the voltage swing seen by the second protective device 303, the peak gate-to-drain voltage ($V_{gd}$) seen by the second protective device 303 is less. Thus, a larger attenuation can be applied to the AC bias component 306 for the second protective device 303. A voltage divider 309 such as, e.g., a resistance network including a plurality of resistors (e.g., $R_1$ 312a, $R_3$ 312b and $R_4$ 312c) is used to attenuate $V_{out}$. As shown in FIG. 5, a single voltage divider 309 can be used to generate the AC bias components (206 and 306) for the first and second protective devices (203 and 303, respectively). In other implementations, a plurality of voltage dividers may be used to generate the AC bias components. For example, independent voltage dividers may be used generate the AC bias components (206 and 306). As discussed above, other voltage dividers may also be used to provide the attenuated versions of the voltage swing 106.

The DC bias component 215 for the first protective device 203 is provided by a first DC bias circuit including a resistor ($R_{S1}$) 218 connected between two current sources 221a and 221b as shown in FIG. 5. A constant DC bias voltage can be added to the AC bias component by controlling the currents ($I_{1A}$ and $I_{1B}$) of the current sources 221a/221b to produce a fixed voltage drop across the resistor ($R_{S1}$) 218. A predefined current level ($I_{def1}=I_{1A}=I_{1B}$) for both current sources 221a/221b produces a defined DC offset of the bias applied to the gate of the corresponding protective device 203. Similarly, the DC bias component 315 for the second protective device 303 is provided by a second DC bias circuit including a resistor ($R_{S2}$) 318 connected between two current sources 321a and 321b. A constant DC bias voltage can be added to the AC bias component by controlling the currents ($I_{2A}$ and $I_{2B}$) of the current sources 321a/321b to produce a fixed voltage drop across the resistor ($R_{S2}$) 318. A predefined current level ($I_{def2}=I_{2A}=I_{2B}$) for both current sources 321a/321b produces a defined DC offset of the bias applied to the gate of the corresponding protective device 303. In some implementations, no DC offset (or shift) of the bias may be used (e.g., $I_{1A}=I_{1B}=0$ and/or $I_{2A}=I_{2B}=0$) and only an AC bias component may be applied to the gate of the corresponding protective device 203 and/or 303.

The AC and DC bias components are combined to produce the applied gate voltages. In the example of FIG. 5, the AC and DC bias components 206 and 215 are combined by connecting the voltage divider 309 to first side of the resistor ($R_{S1}$) 218 and connecting the second side of the resistor 218 to the gate of the first protective device 203 to provide a negative shift and the AC and DC bias components 306 and 315 are combined by connecting the voltage divider 309 to first side of the resistor ($R_{S2}$) 318 and connecting the second side of the resistor 318 to the gate of the second protective device 303 to provide a negative shift. In other implementations, the connections may be reversed to provide a positive shift as in the case of a PMOS device.

To design the protection scheme, the levels of the DC bias components 215/315 needed to operate the first and second protective devices 203/303 is first determined. The DC bias components can be chosen for each protective device 203/303 independent of the magnitude of the voltage swing. Individual DC bias circuits can be used to generate the independent DC bias components. Based at least in part upon the DC bias components 215/315 and the maximum allowable $V_{gd}$, the amount of attenuation of the output voltage ($V_{out}$) can be determined for each of the protective devices 203/303. The peak-to-peak voltage seen by the protective device 303 is reduced to approximately the voltage seen at the gate of the protective device 203 and the peak-to-peak voltage seen by the MOS device 103 is reduced to approximately the voltage seen at the gate of the protective device 303. The elements of the voltage divider 309 may be determined for the attenuation to prevent exceeding the maximum allowable $V_{gd}$. For example, the values of the resistors 312a, 312b and 312c may be determined to provide an AC bias component 206 that would avoid exceeding the $V_{gd}$ limit of the first protective device 203 and to provide an AC bias component 306 that would avoid exceeding the $V_{gd}$ limit of the second protective device 303. By selecting the appropriate resistance values, the resistance network of FIG. 5 can provide an attenuated waveform for each of the protective devices 203/303 that is in-phase with the voltage swings 106 of the output.

In some implementations, the bias voltage applied to the gate of the first and/or second protective devices 203 and/or 303 may be programmable to adjust for variations in the operating conditions of the circuit. For example, the pairs of current sources 221a/221b and/or 321a/321b may be programmable or configurable to allow for changes in the current level to adjust the DC bias component 215 and/or 315, respectively. By adjusting the pair of current sources 221a/221b and/or 321a/321b together, the AC bias components 206 and/or 306 remain unchanged. The voltage divider 309 may also be programmable or configurable to allow for changes in the attenuation of the AC bias components 206 and/or 306. For example, the resistance values of resistors $R_1$ 312a, $R_3$ 312b and/or $R_4$ 312c may be adjustable. In other implementations, the resistors 312 may be replaced by low voltage MOS devices, which may be controlled to adjust the attenuation of the voltage swing 106.

Figure 6:
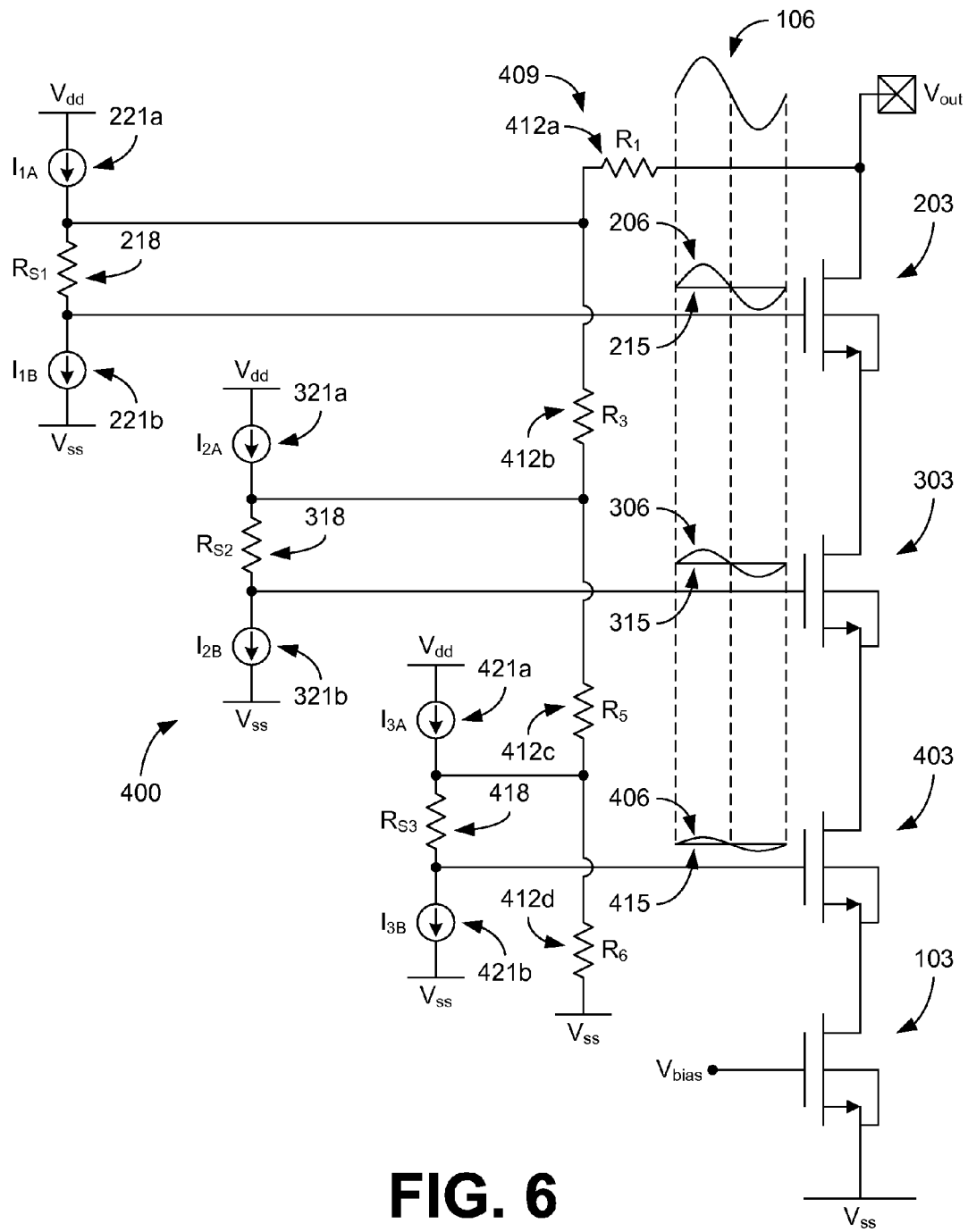

Additional protective devices may be added to handle even larger voltage swings. For instance, FIG. 6 shows another example of the protection scheme using a first protective device 203, a second protective device 303 and a third protective device 403 connected in a cascode configuration to reduce the voltage across the MOS device 103. Gate protection circuitry 400 controls the gate voltages applied to the first, second and third protective devices 203/303/403 to avoid exceeding the device ratings. A combination of AC and DC bias components is provided to the gates of the first and second protective devices 203/303/403.

As in the example of FIG. 5, the attenuation of the output signal is based upon the location of the protective device within the series. The amount of attenuation is the least for the protective device located next to the output connection and the most for the protective device located next to the MOS device 103. In the example of FIG. 5, the AC bias component 206 for the first protective device 203 is the least attenuated version of the voltage swing 106. The AC bias component 306 for the second protective device 303 has a higher attenuation and the AC bias component 406 for the third protective device 403 is the most attenuated version of the voltage swing 106. Because the first protective device 203 reduces the voltage swing seen by the second protective device 303, the peak gate-to-drain voltage ($V_{gd}$) seen by the second protective device 303 is less than the first protective device 203. The peak $V_{gd}$ of the third protective device 403 is further reduced. Thus, a higher attenuation can applied to the AC bias component 306 for the second protective device 303 and even more attenuation can be applied to the AC bias component 406 for the third protective device 403.

A voltage divider 409 such as, e.g., a resistance network including a plurality of resistors (e.g., $R_1$ 412a, $R_3$ 412b, $R_5$ 412c and $R_6$ 412d) is used to attenuate $V_{out}$. As shown in FIG. 6, a single voltage divider 409 can be used to generate the AC bias components (206, 306 and 406) for the first, second, and third protective devices (203, 303 and 403, respectively). In other implementations, a plurality of voltage dividers may be used to generate the AC bias components. For example, two or more independent voltage dividers may be used generate the AC bias components (206, 306 and 406). As discussed above, other voltage dividers may also be used to provide the attenuated versions of the voltage swing 106.

Individual DC bias circuits can be used to generate the independent DC bias components for each of the protective devices. The DC bias component 215 for the first protective device 203 is provided by a first DC bias circuit including a resistor ($R_{S1}$) 218 connected between two current sources 221a and 221b as shown in FIG. 6. Similarly, the DC bias component 315 for the second protective device 303 is provided by a second DC bias circuit including a resistor ($R_{S2}$) 318 connected between two current sources 321a and 321b and the DC bias component 415 for the third protective device 403 is provided by a third DC bias circuit including a resistor ($R_{S3}$) 418 connected between two current sources 421a and 421b. A constant DC bias voltage can be added to the AC bias component by controlling the currents ($I_{1A}$ and $I_{1B}$, $I_{2A}$ and $I_{2B}$, and/or $I_{3A}$ and $I_{3B}$) of the current sources 221a/221b, 321a/321b, and/or 421a/421b to produce a fixed voltage drop across the resistor 218, 318, and/or 418, respectively. A predefined current level ($I_{def1}=I_{1A}=I_{1B}$, $I_{def2}=I_{2A}=I_{2B}$, and/or $I_{def3}=I_{3A}=I_{3B}$) for the current sources 221a/221b, 321a/321b, and/or 421a/421b produces a defined DC offset of the bias applied to the gate of the corresponding protective device 203, 303, and/or 403, respectively. In some implementations, no DC offset (or shift) of the bias may be used (e.g., $I_{1A}=I_{1B}=0$, $I_{2A}=I_{2B}=0$ and/or $I_{3A}=I_{3B}=0$) and only an AC bias component may be applied to the gate of the corresponding protective device 203, 303, and/or 403.

The AC and DC bias components are combined to produce the applied gate voltages. In the example of FIG. 6, the AC and DC bias components 206 and 215 are combined by connecting the voltage divider 409 to first side of the resistor ($R_{S1}$) 218 and connecting the second side of the resistor 218 to the gate of the first protective device 203 to provide a negative shift. Similarly, the AC and DC bias components 306 and 315 are combined by connecting the voltage divider 409 to first side of the resistor ($R_{S2}$) 318 and connecting the second side of the resistor 318 to the gate of the second protective device 303 to provide a negative shift and the AC and DC bias components 406 and 415 are combined by connecting the voltage divider 409 to first side of the resistor ($R_{S3}$) 418 and connecting the second side of the resistor 418 to the gate of the second protective device 403 to provide a negative shift. In other implementations, the connections may be reversed to provide a positive shift as in the case of a PMOS device.

To design the protection scheme, the levels of the DC bias components 215/315/415 needed to operate the first, second and third protective devices 203/303/403 is first determined. The DC bias components can be chosen for each protective device 203/303/403 independent of the magnitude of the voltage swing. Based at least in part upon the DC bias components 215/315/415 and the maximum allowable $V_{gd}$, the amount of attenuation of the output voltage ($V_{out}$) can be determined for each of the protective devices 203/303/403. The peak-to-peak voltage seen by the protective device 303 is reduced to approximately the voltage seen at the gate of the protective device 203, the peak-to-peak voltage seen by the protective device 403 is reduced to approximately the voltage seen at the gate of the protective device 303, and the peak-to-peak voltage seen by the MOS device 103 is reduced to approximately the voltage seen at the gate of the protective device 403. The elements of the voltage divider 409 may be determined for the attenuation to prevent exceeding the maximum allowable $V_{gd}$. For example, the values of the resistors 412a, 412b, 412c and 412d may be determined to provide an AC bias components 206, 306, and 406 that would avoid exceeding the $V_{gd}$ limits of the first, second and third protective devices 203, 303, and 403, respectively. By selecting the appropriate resistance values, the resistance network of FIG. 6 can provide an attenuated waveform for each of the protective devices 203/303/403 that is in-phase with the voltage swings 106 of the output.

In some implementations, the bias voltage applied to the gate of the first, second, and/or third protective devices 203, 303 and/or 403 may be programmable to adjust for variations in the operating conditions of the circuit. For example, the pairs of current sources 221a/221b, 321a/321b and/or 421a/421b may be programmable or configurable to allow for changes in the current level to adjust the DC bias component 215, 315 and/or 415, respectively. By adjusting the pair of current sources 221a/221b, 321a/321b and/or 421a/421b together, the AC bias components 206, 306 and/or 406 remain unchanged. The voltage divider 409 may also be programmable or configurable to allow for changes in the attenuation of the AC bias components 206, 306 and/or 406. For example, the resistance values of resistors $R_1$ 412a, $R_3$ 412b, $R_5$ 412c and/or $R_6$ 412d may be adjustable. In other implementations, the resistors 412 may be replaced by low voltage MOS devices, which may be controlled to adjust the attenuation of the voltage swing 106.

As can be understood, the protection scheme can be extended to handle higher voltage swings by including additional protective devices and expanding the gate protection circuitry accordingly. In this way, the use of an external capacitor and/or the use of LDMOS devices can be avoided, which can reduce the overall area usage. This also allows for negative voltage swings in the output voltage. The protection scheme may be used to implement any current source or other functionality that sees large swings at its output and/or internal node connection of the circuitry. For example, it may be used in ground referenced audio drivers with high output swings such as those used in, e.g., set-top boxes or other electronic devices. The protection scheme may also be utilized in low geometry implementations in IC chips where the breakdown voltages decrease as the device density increases.

Figure 7:
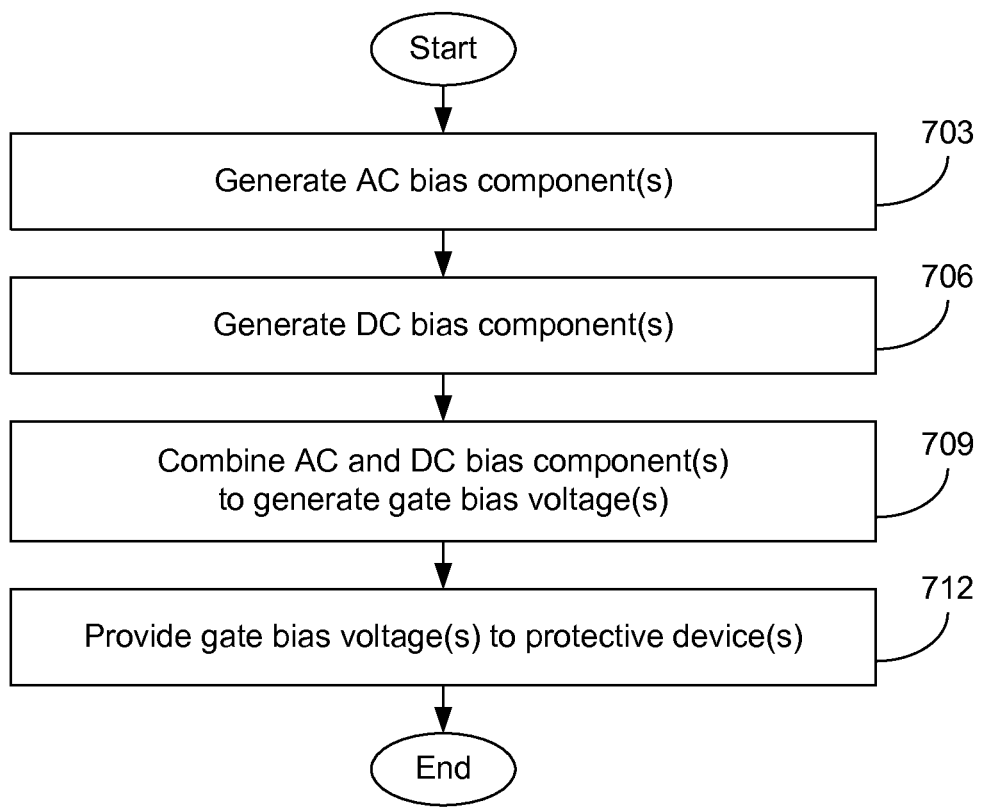
FIG. 7 is flow chart illustrating an example of the protection scheme in accordance with various embodiments of the present disclosure.

Referring now to FIG. 7, shown is a flow chart illustrating an example of the protection scheme in accordance with various embodiments of the present disclosure. Beginning with 703, an AC bias component corresponding to a protective device is generated. For example, the output voltage of an output connection corresponding to a MOS device 103 (FIGS. 4-6) can be attenuated to produce the AC bias component. For example, a voltage divider 209/309/409 (FIGS. 4-6) may be used to attenuate the voltage swing 106 (FIGS. 4-6) to generate the AC bias component 206/306/406 (FIGS. 4-6). The amount of attenuation can be chosen to avoid exceeding the operational ratings of the corresponding protective device 203/303/403 (FIGS. 4-6).

In some implementations, a plurality of AC bias components 206/306/406 (FIGS. 5-6) may be generated at 703 for a plurality of corresponding protective devices 203/303/403 (FIGS. 5-6) that are electrically coupled between the MOS device 103 and the output connection. For example, the voltage divider 409 of FIG. 6 generates three AC bias components 206/306/406 for the corresponding protective devices 203/303/403 that are connected in series between the output connection and the MOS device 103. Each of the attenuated waveforms of the AC bias components 206/306/406 can be generated concurrently and are in-phase with the voltage swings 106 at the output corresponding to the MOS device 103.

At 706, a DC bias component corresponding to a protective device is generated. A constant offset voltage may be generated as the DC bias component by DC bias circuitry. For example, the DC bias component 215/315/415 (FIGS. 4-6) may be generated as a voltage across a resistor 218/318/418 (FIGS. 4-6) connected between a pair of current sources 221/321/421 (FIGS. 4-6). By setting the current level for the two current sources 221/321/421 (FIGS. 4-6) to the same predefined value, the DC bias component 215/315/415 (FIGS. 4-6) is determined based upon the current level and the resistance of the resistor 218/318/418 (FIGS. 4-6). In some embodiments, the current sources may be programmable to allow adjustment of the current levels for operational conditions.

In some implementations, a plurality of DC bias components 215/315/415 (FIGS. 5-6) may be generated at 706 for a plurality of corresponding protective devices 203/303/403 (FIGS. 5-6) that are electrically coupled between the MOS device 103 and the output connection. For example, separate DC bias circuits can be used to generate independent DC bias components for each corresponding protective device 203/303/403 (FIGS. 5-6). Each DC bias circuit can include a resistor 218/318/418 (FIGS. 4-6) connected between a pair of current sources 221/321/421 (FIGS. 4-6). Each of the DC bias components 215/315/415 can be generated concurrently with each of the other DC bias components 215/315/415 and concurrent with the generation of the AC bias components 206/306/406 (FIGS. 5-6).

Corresponding AC and DC bias components are combined to generate a gate bias voltage at 709. Where multiple protective devices are used, gate bias voltages can be generated for each corresponding protective device 203/303/403 (FIGS. 5-6) from the corresponding DC bias components 215/315/415 (FIGS. 5-6) and AC bias component 206/306/406 (FIGS. 5-6). In some implementations, the AC and DC bias components may be combined by the DC bias circuitry. At 712, the gate bias voltage is provided to the corresponding protective device 203/303/403 (FIGS. 4-6). Where multiple protective devices are used, the gate bias voltages are concurrently provided to the corresponding protective devices 203/303/403 (FIGS. 5-6) to avoid stressing the protective devices 203/303/403. The varying gate bias voltages reduce the peak $V_{gd}$ seen by the protective devices 203/303/403 as described previously.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A circuit, comprising:
a metal oxide semiconductor (MOS) device;
a protective device connected between the MOS device and an output voltage connection of the MOS device; and
gate protection circuitry configured to provide a bias voltage to a gate of the protective device, the bias voltage comprising a DC bias component and an AC bias component that synchronously varies with a voltage of the output voltage connection, wherein
the gate protection circuitry comprises a DC bias circuit comprising a resistor directly connected between a pair of current sources and the DC bias component is based upon a current level of the pair of current sources and a resistance of the resistor.

2. The circuit of claim 1, wherein the AC bias component is an attenuated version of the voltage of the output voltage connection.

3. The circuit of claim 1, wherein the gate protection circuitry comprises a voltage divider configured to provide the AC bias component.

4. The circuit of claim 3, wherein the voltage divider comprises a resistance network including a plurality of resistors.

5. The circuit of claim 3, wherein the DC bias circuit is configured to combine the AC bias component with the DC bias component.

6. The circuit of claim 5, wherein the DC bias component is generated by the DC bias circuit.

7. The circuit of claim 1, wherein the current level of the pair of current sources is programmable.

8. An integrated circuit (IC) chip comprising at least one of the circuit of claim 1.

9. A circuit, comprising:
a metal oxide semiconductor (MOS) device;
a plurality of protective devices connected between the MOS device and an output voltage connection of the MOS device; and
gate protection circuitry configured to provide a plurality of bias voltages to the plurality of protective devices, each of the plurality of bias voltages provided to a gate of a corresponding one of the plurality of protective devices, each of the plurality of bias voltages comprising a DC bias component and an AC bias component that synchronously varies with a voltage of the output voltage connection.

10. The circuit of claim 9, wherein the AC bias component of each of the plurality of bias voltages is a different attenuated version of the voltage of the output voltage connection.

11. The circuit of claim 9, wherein the gate protection circuitry comprises a voltage divider configured to provide the AC bias component of each of the plurality of bias voltages.

12. The circuit of claim 11, wherein the voltage divider comprises a resistance network including a plurality of resistors.

13. The circuit of claim 11, wherein the gate protection circuitry further comprises a plurality of DC bias circuits, each of the plurality of DC bias circuits corresponding to one of the plurality of protective devices, each of the plurality of DC bias circuits configured to combine the AC bias component of the corresponding one of the plurality of protective devices with the DC bias component.

14. The circuit of claim 13, wherein the DC bias component of each of the plurality of bias voltages is generated by a corresponding one of the plurality of DC bias circuits.

15. An integrated circuit (IC) chip comprising the circuit of claim 9.

16. A method for protecting a metal oxide semiconductor (MOS) device, comprising:
attenuating an output voltage of an output connection corresponding to the MOS device to generate a plurality of attenuated output voltages, each of the plurality of attenuated output voltages corresponding to one of a series of protective devices electrically coupled between the MOS device and the output connection;
combining each of the plurality of attenuated output voltages with a constant offset voltage to generate a plurality of gate bias voltages, each of the plurality of gate bias voltages corresponding to one of the series of protective devices; and
providing each of the plurality of gate bias voltages to the corresponding one of the series of protective devices.

17. The method of claim 16, wherein each of the plurality of attenuated output voltages is combined with a constant offset voltage associated with the corresponding one of the series of protective devices.

18. The method of claim 17, further comprising generating the constant offset voltage associated with each corresponding one of the series of protective devices.

* * * * *